United States Patent
Lin et al.

[11] Patent Number: 6,096,594
[45] Date of Patent: Aug. 1, 2000

[54] FABRICATING METHOD OF A DYNAMIC RANDOM ACCESS MEMORY

[75] Inventors: Kun-Chi Lin, Hsinchu; Chia-Wen Liang, Hsinchu Hsien; Hal Lee, Taipei, all of Taiwan

[73] Assignee: United Microelectronics Corp., Hsinchu, Taiwan

[21] Appl. No.: 09/188,652

[22] Filed: Nov. 9, 1998

[51] Int. Cl.$^7$ .................................................. H01L 21/8249
[52] U.S. Cl. ...................... 438/238; 438/238; 438/252; 438/695; 438/738; 438/762; 438/787; 437/52; 437/60; 437/919
[58] Field of Search ..................... 438/695, 738, 438/787, 762, 252, 238; 437/52, 60, 919

[56] References Cited

U.S. PATENT DOCUMENTS

| | | | |
|---|---|---|---|
| 5,872,063 | 2/1999 | Chao et al. | 438/762 |
| 5,998,255 | 12/1999 | Kung et al. | 438/252 |
| 6,037,211 | 3/2000 | Jeng et al. | 438/253 |

*Primary Examiner*—David Nelms
*Assistant Examiner*—Phuc Dang
*Attorney, Agent, or Firm*—Thomas, Kayden, Horstemeyer & Risley

[57] ABSTRACT

The present invention provides a fabricating method and structure of a dynamic random access memory. In this method, a substrate having a transistor thereon is provided. A bit line is formed on the substrate. The bit line is electrically coupled with the transistor through a contact hole. A second dielectric layer having a node contact opening is formed on the bit line. An etching step is performed to etch the bit line. A concave surface is formed on the sidewall of the bit line. Spacer layers are formed on the sidewalls of the node contact opening. Each spacer layer is used to insulate the concave surface. Thus, from the top-view layout, a portion of the node contact opening can overlap with the bit line. Thus, the size of DRAM is effectively reduced.

31 Claims, 6 Drawing Sheets

FABRICATING METHOD OF A DYNAMIC RANDOM ACCESS MEMORY

BACKGROUND OF THE INVENTION

1. Field of Invention

The present invention relates to a semiconductor fabricating method. More particularly, the present invention relates to a fabricating method of a dynamic random access memory (DRAM).

2. Description of Related Art

Two of the important strategies in the semiconductor industry are increasing the device's performance and decreasing the process cost. With the trend toward high integration density, the size of the DRAM capacitor must be further decreased. As the size of the DRAM capacitor decreases, the quality of the capacitor may also decrease. For example, as the DRAM size is decreased, the resistance effect becomes serious enough to reduce the device's performance.

It is important to decrease the device size in the DRAM manufacture processes. Typically, a DRAM includes a transfer transistor and a capacitor. The capacitor is electrically coupled with a source/drain region. A bit line, which comes from an isolation layer, is electrically coupled with the surface of the source/drain region through a contact hole.

Figure 1:
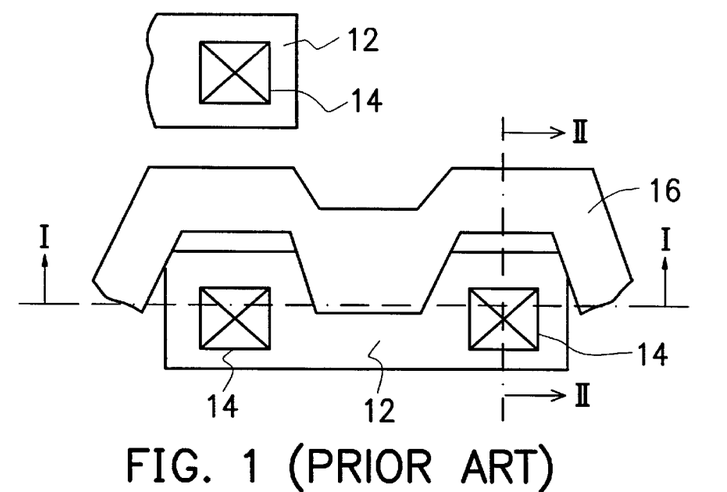
FIG. 1 is a top view of a layout of a conventional DRAM.
Figure 2A:
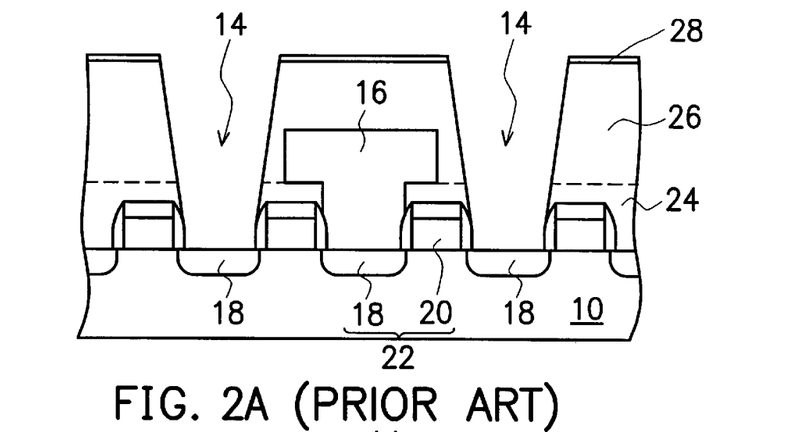
FIG. 2A is a cross-sectional view of a portion of the conventional DRAM of FIG. 1 taken along line I—I.
Figure 2B:
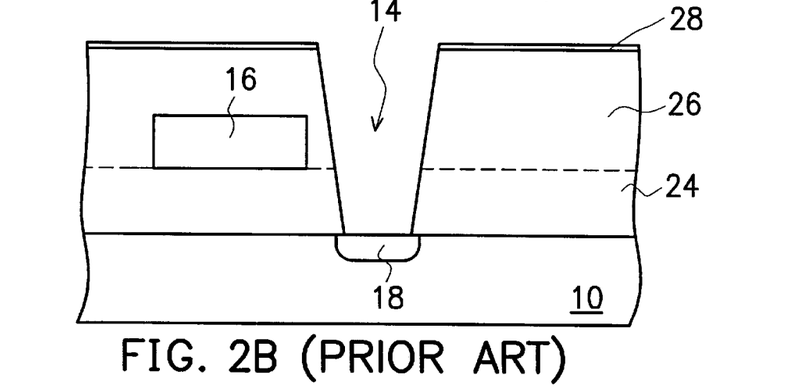
FIG. 2B is a cross-sectional view of a portion of the conventional DRAM of FIG. 1 taken along line II—II.

FIG. 1 is a top view of a layout of a conventional DRAM. FIG. 2A is a cross-sectional view of a portion of the conventional DRAM of FIG. 1 taken along line I—I. FIG. 2B is a cross-sectional view of a portion of the conventional DRAM of FIG. 1 taken along line II—II.

In FIGS. 1 through 2B, a semiconductor substrate 10 is provided. An active region 12 is defined on the substrate 100. A transistor 22 is formed on the active region 12. The transistor 22 includes a gate 20 and a source/drain region 18. A first dielectric layer 24 is formed on the transistor 22. A second dielectric layer 26 is formed on the first dielectric layer 24. A bit line 16 is formed in the first dielectric layer 24 and the second dielectric layer 26. A photoresist layer 28 is formed on the second dielectric layer 26. A node contact 14 is formed in the first dielectric layer 24 and the second dielectric layer 26. The source/drain region 14 is electrically coupled with a capacitor (not shown) through the node contact 14.

The bit line 16 must be separated from the node contact 14. (Shown in FIG. 1) In the layout of the DRAM, when viewed from the top, the bit line 16 cannot overlap with the node contact 14. This separation prevents the bit line 16 from shorting with the node contact. Unfortunately, the bit line 16 and the node contact 14 cannot overlap in the layout, the downsizing of the DRAM components is limited.

SUMMARY OF THE INVENTION

It is an object of the invention to provide a fabrication method for a DRAM.

It is another object of the invention to provide a DRAM that can effectively reduce the size of the DRAM.

Accordingly, the present invention provides a fabrication method for DRAM which includes the step of forming a substrate. A first dielectric layer having a contact hole therein is formed on the substrate. The contact hole exposes the source/drain region. A bit line is formed on the first dielectric layer. The bit line is electrically coupled with the source/drain region through the contact hole. A second dielectric layer is formed on the bit line. A photolithography step is performed to form a patterned photoresist layer on the second dielectric layer. A first etching step is performed. The patterned photoresist layer is used as a mask. The bit line is used as an etching stop layer. The second dielectric layer is etched to form a node contact opening. A second etching step is performed to etch the bit line by using the first dielectric layer as an etching stop layer. A concave surface is formed in the sidewall of the bit line. The patterned photoresist layer is removed. An isolation layer is formed on the sidewall of the node contact opening and the concave surface. The isolation layer fills the concave surface. The isolation layer does not completely fill the node contact opening. A second etching step is performed to etch the isolation layer to form spacer layers on the sidewall of the node contact opening. The spacer layers completely cover the concave surface. A third etching step is performed to etch the first dielectric layer by using the spacer layers as masks. A storage node opening is formed. The storage node opening exposes the source/drain region. A capacitor is formed in the storage node opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 3:
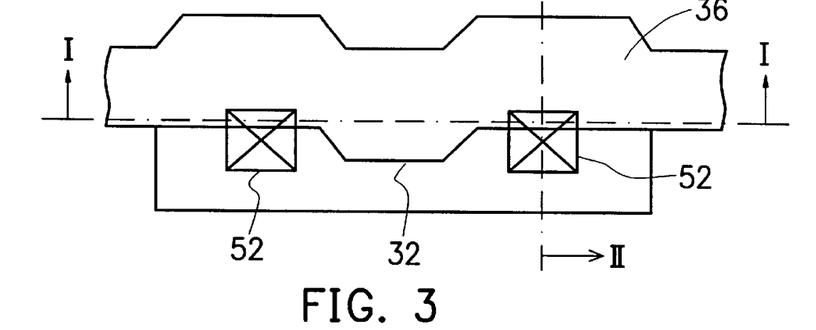
FIG. 3 is a top view of a layout of a DRAM according to one preferred embodiment of the invention.

FIG. 3 is a top view of a layout of a DRAM according to one preferred embodiment of the invention. FIGS. 4A through 4F are cross-sectional views of a portion of the DRAM of FIG. 3 taken along line I—I, according to one preferred embodiment of the invention. FIGS. 5A through 5F are cross-sectional views of a portion of the DRAM of FIG. 3 taken along line II—II, according to one preferred embodiment of the invention.

The present invention provides an improved fabricating method and a structure of a dynamic random access memory. The spacer layers are used to insulate a bit line and a storage node opening. The spacer layers provide good insulation between the bit line and the storage node. Therefore the bit line can overlap with the node contact in the top view of the layout. Differently from the conventional DRAM, which the bit line must be far away from the node contact in the top-view layout, the bit line and the node contact can overlap in the top view of the layout of the DRAM according to the present invention. Hence, the DRAM size can be further reduced.

Figure 4A:
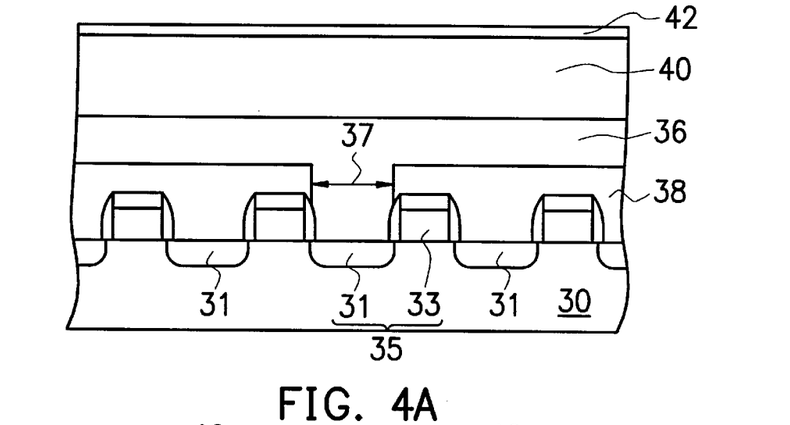
FIGS. 4A through 4F are cross-sectional views of a portion of the DRAM of FIG. 3 taken along line I—I, according to one preferred embodiment of the invention.
Figure 5A:
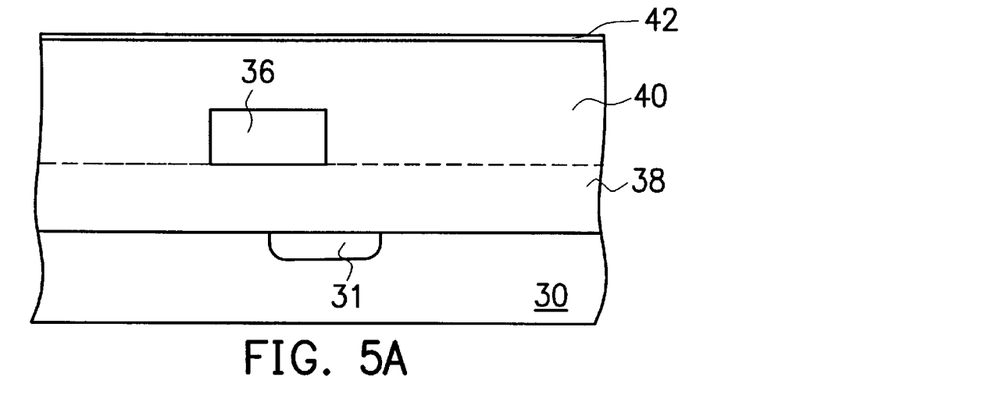
FIGS. 5A through 5F are cross-sectional views of a portion of the DRAM of FIG. 3 taken along line II—II, according to one preferred embodiment of the invention.

In FIGS. 4A and 5A, a semiconductor substrate 30 is provided. A plurality of transistors 35 is formed on the semiconductor substrate 30. Each transistor 35 has a source/drain region 31. A first dielectric layer 38 is formed on the transistors 35 and the semiconductor substrate 30. The material of the first dielectric layer 38 can be silicon oxide, for example. The first dielectric layer 38 can be formed by low-pressure chemical vapor deposition (LPCVD) or by depositing silicon oxide by plasma enhanced chemical vapor deposition (PECVD) at a temperature of about 300° C. to 700° C., for example. A contact hole 37 is formed in the first dielectric layer 38 to expose the source/drain region 31. A bit line 36 is formed on the first dielectric layer 38 to fill the contact hole 37. The bit line 36 is electrically coupled with the source/drain region 31 through the contact hole 37. For example, silane is used as a reactant gas and arsenic (As) and phosphorus (P) ion are doped at the same time by using a low pressure chemical vapor deposition to form the bit line 36 at a temperature of about 550° C. to 650° C. The bit line 36 is composed of a doped polysilicon layer and a polycide layer. In general, the gate 33 is used as a word line. The gate 33 is perpendicular to the bit line 36. A second dielectric layer 40 and a thin stop layer 42 are formed in sequence over the bit line 36. Typically, a chemical mechanical polishing (CMP) method is performed to planarize the second dielectric layer 40. The stop layer 42 has a thickness of hundreds of Å. The material of the stop layer 42 can be silicon riched oxide (SRO) or silicon oxide, for example.

Figure 4B:
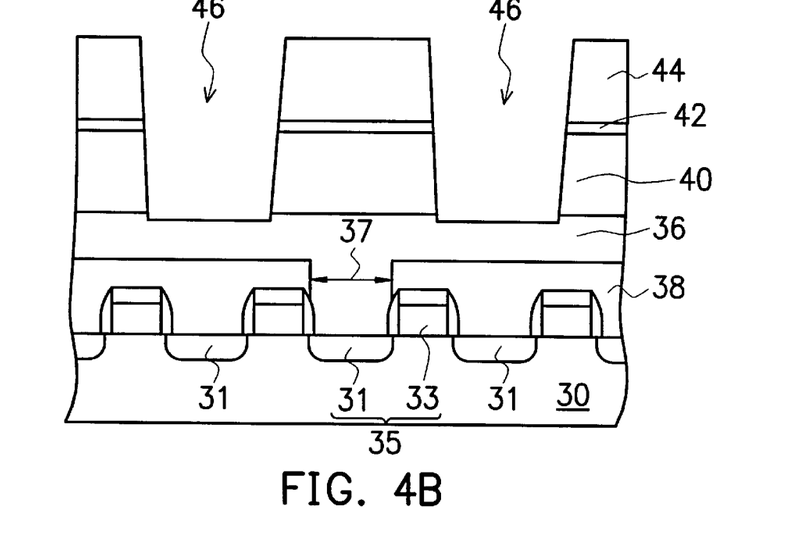
Figure 5B:
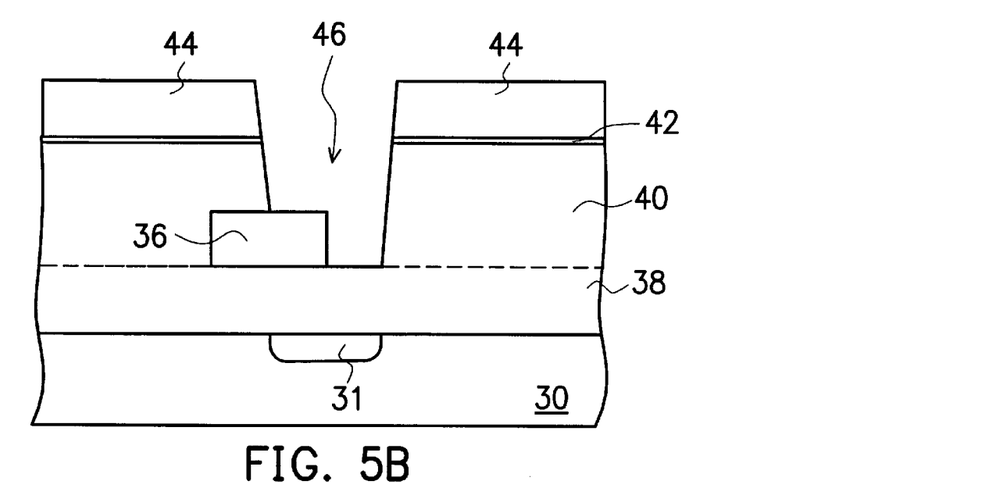

In FIGS. 4B and 5B, a photolithography step is performed. A patterned photoresist layer 44 is formed on the stop layer 42. A first etching step is performed. The etching step can be anisotropic dry etching, for example, preferably using $CHF_3$ as the etchant. The patterned photoresist layer 44 is used as a mask. The bit line 36 is used as an etching stop layer. The second dielectric layer 40 is etched to form a node contact opening 46.

Figure 4C:
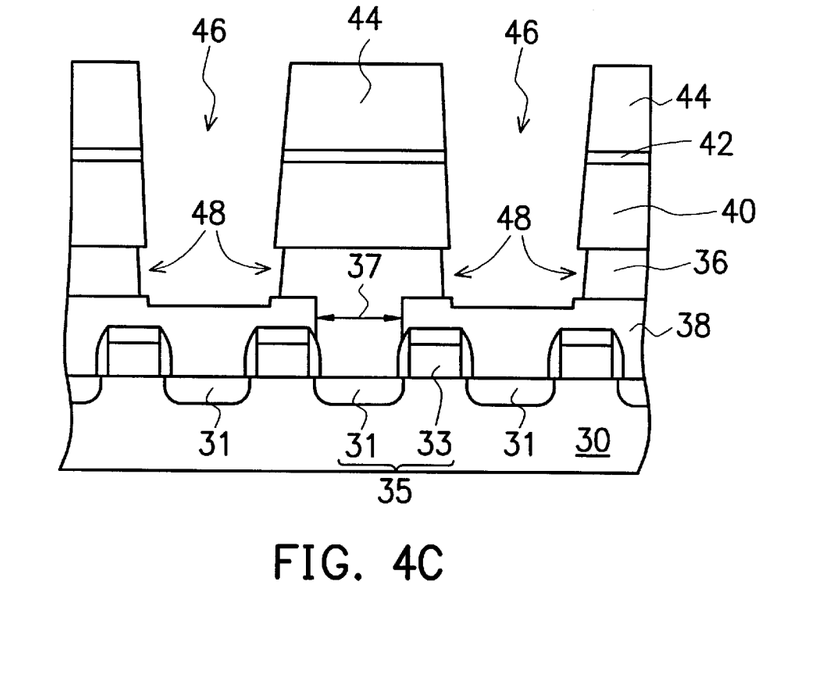
Figure 5C:
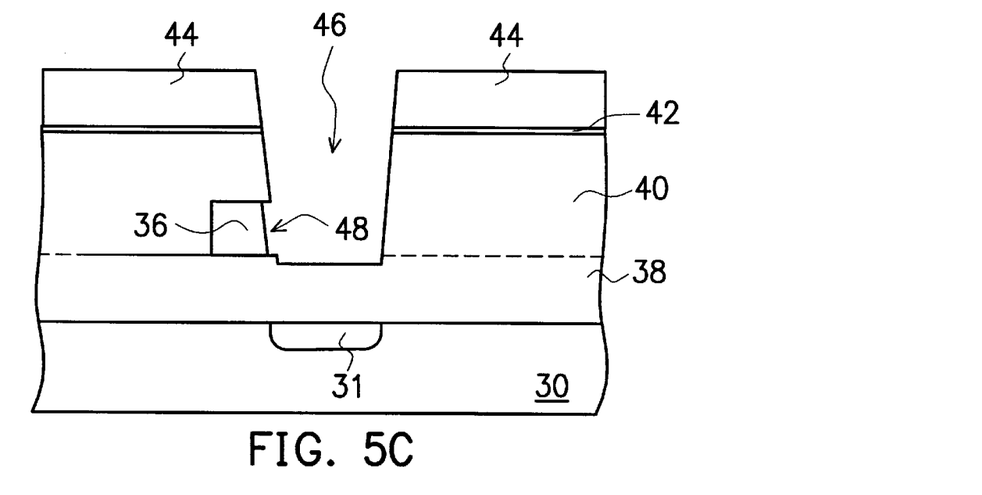

In FIGS. 4C and 5C, a second etching step is performed by anisotropic dry etching, for example. The patterned photoresist layer 44 is used as a mask. The node contact opening 46 and the bit line 36 are etched by using the first dielectric layer 38 as an etching stop layer. A portion of the bit line 36 between the second dielectric layer 40 and the first dielectric layer 38 is etched. A concave surface 48 is formed in the sidewalls of the bit line 36. There also can be several concave surfaces formed in the sidewall of the bit line 36 at the same time. In general, the depth of the concave surface 48 is about 200 to 500 Å. The patterned photoresist layer 44 is removed.

Figure 4D:
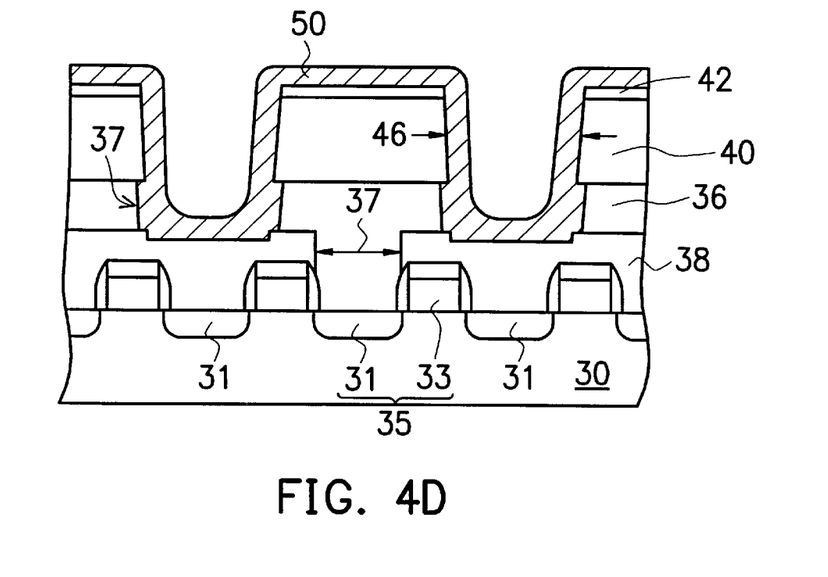
Figure 5D:
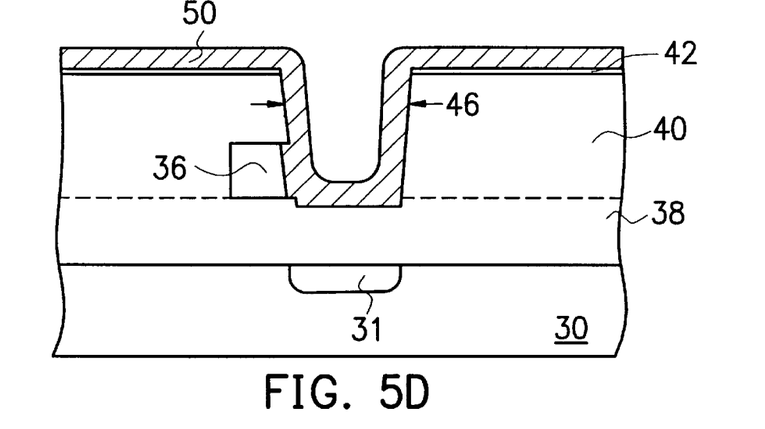

In FIGS. 4D and 5D, an isolation layer 50 is formed on the sidewall of the node contact opening 46 and the concave surface 48. Preferably, a conformal isolation layer is formed on the sidewalls of the node contact opening 46 and the concave surface 48. The isolation layer 50 completely covers the concave surface 48, but isolation layer 50 does not completely fill the node contact opening 46. The material of the isolation layer 50 can be silicon nitride (SiN) or silicon oxide, for example. The thickness of the isolation layer 50 is about 300 to 800 Å. The isolation layer 50 can be formed by low-pressure vapor deposition or thermal oxidation, for example. For example, a silicon oxide layer is deposited by using tetra-ethyl-ortho-silicate (TEOS) as a reactant gas.

Figure 4E:
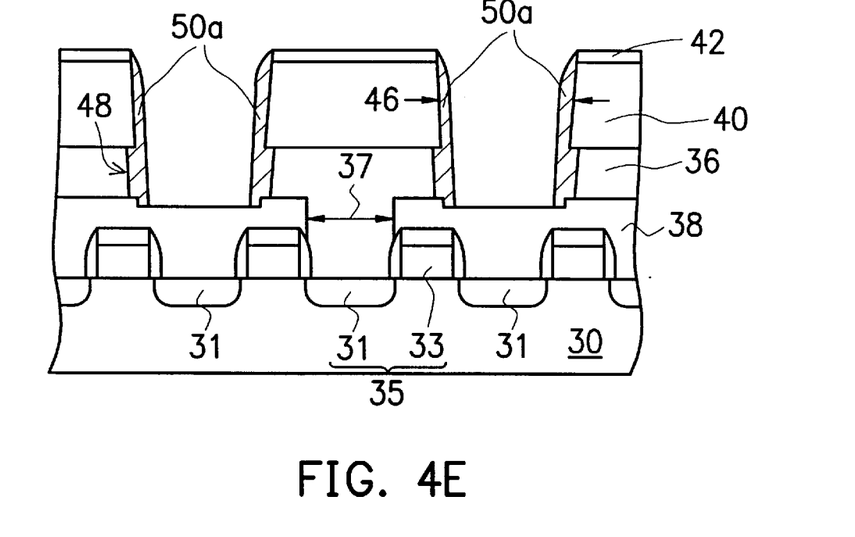
Figure 5E:
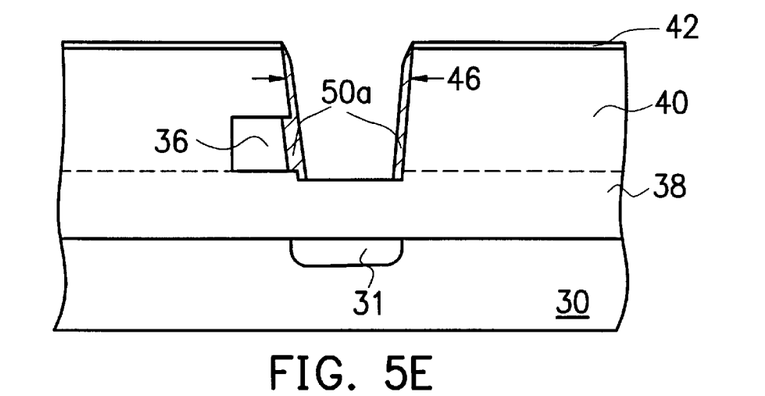

In FIGS. 4E and 5E, a third etching step is performed. The method for the etching step is an etch back method, such as an anisotropic dry etching method or an anisotropic reactive ion etching method. The anisotropic etching method preferably uses $CHF_3$ as an etchant at a temperature of about 300° C. to 500° C. Spacer layers 50a are formed on the sidewalls of the electrode contact opening 46. Each spacer layer of the spacer layers 50a completely covers the each concave surface 48 in the sidewall of the bit line 36. The spacer layers 50a are the characteristic of the present invention. The spacer layers 50a are used to insulate the bit line 36 from other components. When the layout of the DRAM is viewed from the top, it can be seen that a portion of the electrode contact node 46 and the bit line 36 overlap. Hence, a high-density DRAM can be formed with an effectively reduced size.

Figure 4F:
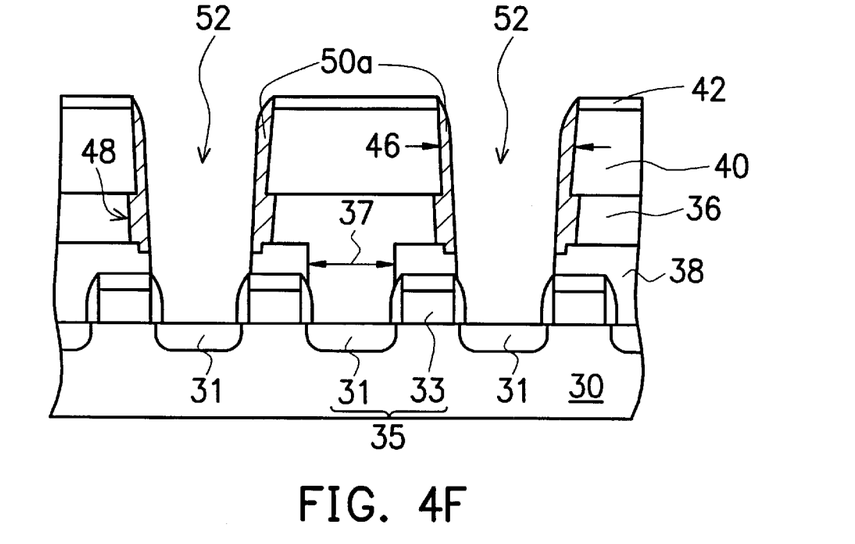
Figure 5F:
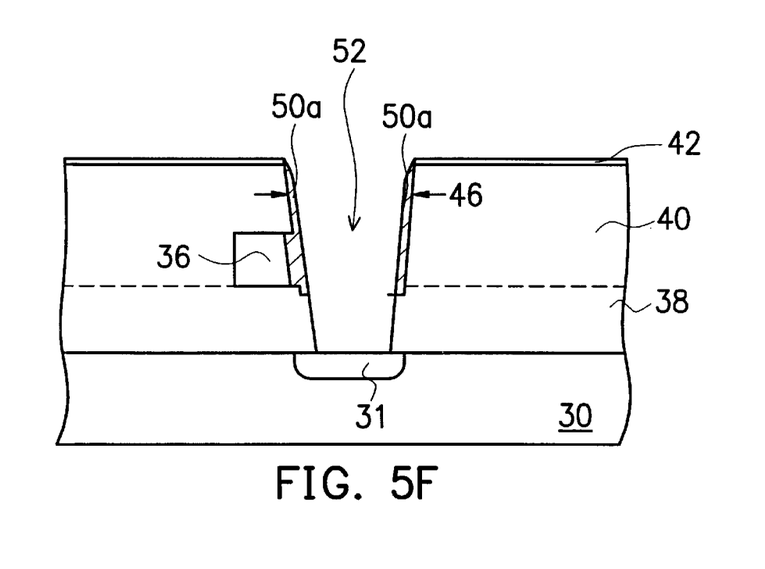

In FIGS. 4F and 5F, a fourth etching step is performed. For example, an anisotropic dry etching method or an anisotropic reactive ion etching method is used. Spacer layers 50a are used as masks. The anisotropic etching method preferably uses $CHF_3$ as an etchant at a temperature of about 300° C. to 500° C. The first dielectric layer 38 is etched to expose a source/drain region 31 to form a storage node opening 52.

A capacitor (not shown) is formed in the storage node opening 52. The capacitor includes a bottom electrode (not shown), a third dielectric layer (not shown), and a top electrode (not shown). The bottom electrode is electrically coupled with the source/drain region 31 through the storage node opening 52. A DRAM according to one preferred embodiment of the invention is completed. The material of the bottom electrode and the top electrode can be doped polysilicon, for example. The method of forming the bottom electrode and the top electrode can be formed by low-pressure chemical vapor deposition at a temperature of about 550° C. to 650° C. The thickness of the third dielectric layer is about 40 Å to 80 Å. The third dielectric layer can be a silicon oxide/silicon nitride/silicon oxide layer (ONO). For example, the ONO layer can be formed by sequentially forming a silicon oxide layer having a thickness of about 10 Å to 20 Å and a silicon nitride layer having a thickness of about 50 Å to 80 Å, and then performing a hot oxidation method to form a silicon oxide layer on the silicon nitride layer.

In particular, the bit line 36 and the storage node opening 52 overlap when viewed from the top. (shown in FIG. 3) The spacer layers 50a insulate the bit line 36 and the storage node opening 52. In contrast with the conventional DRAM, in which the bit line must be far away from the storage node opening in the top view of the layout, the bit line 36 and the storage node opening 52 overlap in the top view of the layout of the DRAM according to the present invention. Hence, the DRAM size can be further reduced.

In summary, the characters of the present invention are:
1. The spacer layers 50a insulate a bit line 36 and a node contact opening 46. The spacer layers 50a provide a good insulation between the bit line 36 and the node contact opening 46. Therefore, the bit line 36 can overlap with the storage node opening 46 as shown in the top view of the layout. (Shown in FIG. 3)
2. In contrast with the conventional DRAM, in which the bit line 36 must be far away from the storage node opening 52 in the top view of the layout, the bit line 36 and the storage node opening 52 can overlap in the top view of the layout of the DRAM according to the present invention. Hence, the DRAM size can be further reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a dynamic random access memory (DRAM), wherein the method comprises the steps of:

providing a substrate;

forming a first dielectric layer having a contact hole therein on the substrate, wherein the contact hole exposes the substrate;

forming a bit line and a second dielectric layer over the first dielectric layer;

performing a photolithography step to form a patterned photoresist layer on the second dielectric layer;

performing a first etching step and using the patterned photoresist layer as a mask to etch the second dielectric layer and the bit line, wherein the first dielectric layer is used as an etching stop layer, a node contact opening is formed in the second dielectric layer to expose the bit line, and a concave surface is formed in a sidewall of the bit line;

removing the patterned photoresist layer;

forming an isolation layer on the sidewall of the node contact opening and the concave surface, wherein the isolation layer fills the concave surface and the isolation layer does not completely fill the node contact opening;

performing a second etching step to etch the isolation layer and form a spacer layer on a sidewall of the node contact opening, wherein the spacer layer completely covers the concave surface; and performing a third etching step, wherein the first dielectric layer is etched to form a storage node opening, the spacer layers are used as masks.

2. The method of claim 1, wherein the step of forming a storage node opening further includes forming a capacitor.

3. The method of claim 2, wherein the capacitor includes a bottom electrode electrically coupled with the source/drain region through the storage node contact, a third dielectric layer between the bottom electrode and the top electrode, and a top electrode, wherein the spacer layer is used to insulate the bottom electrode and the bit line.

4. The method of claim 1, wherein the method of claim 1 further includes forming a stop layer on the second dielectric layer.

5. The method of claim 4, wherein the material of the stop layer includes nitride silicon.

6. The method of claim 4, wherein the material of the stop layer includes silicon riched oxide.

7. The method of claim 1, wherein the bit line and the electrode contact node overlap in the top view of the layout.

8. The method of claim 1, wherein the depth of the concave surface is about 200 Å to 500 Å.

9. The method of claim 1, wherein the thickness of the isolation layer is about 300 Å to 800 Å.

10. The method of claim 1, wherein the material of the isolation layer includes silicon nitride.

11. The method of claim 1, wherein the material of the isolation layer includes silicon oxide.

12. The method of claim 1, wherein the first etching step includes anisotropic dry etching.

13. The method of claim 1, wherein the second etching step includes anisotropic dry etching.

14. The method of claim 1, wherein the third etching step includes anisotropic dry etching.

15. The method of claim 1, wherein the step of forming the bit line includes using silane as a reactant gas and As and P ion are doped at the same time by using low pressure chemical vapor deposition at a temperature of about 550° C. to 650° C. to form a doped polysilicon layer and a polycide layer.

16. A method of fabricating a dynamic random access memory (DRAM), wherein the method comprises the steps of:

providing a substrate having a transistor thereon, wherein the transistor includes a source/drain region;

forming first dielectric layer having a contact hole on the transistor and the substrate, wherein the contact hole exposes the source/drain region;

forming a bit line on the first dielectric layer, wherein the bit line is electrically coupled with the source/drain region through the contact hole;

forming a second dielectric layer on the bit line;

performing a photolithography step to form a patterned photoresist layer on the second dielectric layer;

performing a first etching step to etch the second dielectric layer to form a node contact opening by using the patterned photoresist layer as a mask and bit line as an etching stop layer;

performing the second etching step to form a concave surface in a sidewall of the bit line by using the first dielectric layer as an etching stop layer, wherein the node contact opening exposes the bit line after the second etching step is performed;

removing the patterned photoresist layer;

forming an isolation layer on a sidewall of the node contact opening and the concave surface, wherein the isolation layer covers the concave surface and the isolation layer does not completely fill the node contact opening;

performing a third etching step to etch the isolation layer to form spacer layers on the sidewall of the node contact opening, wherein the spacer layers cover the concave surface; and performing a fourth etching step to etch the first dielectric layer to form a storage node opening exposing the source/drain region by using the spacer layers as masks.

17. The method of claim 16, wherein the step of forming a storage node opening further includes forming a capacitor.

18. The method of claim 17, wherein the capacitor includes a bottom electrode, a third dielectric layer, and a top electrode, wherein the bottom electrode is electrically coupled with the source/drain region through the storage node contact, the third dielectric layer is between the bottom electrode and the top electrode, and the spacer layer is used to insulate the bottom electrode and the bit line.

19. The method of claim 16, wherein the method of claim 1 further includes forming a thin stop layer on the second dielectric layer.

20. The method of claim 19, wherein the material of the thin stop layer includes silicon nitride.

21. The method of claim 19, wherein the material of the thin stop layer includes silicon riched oxide of polysilicon.

22. The method of claim 16, wherein from the top-view layout, the bit line and the electrode contact node overlap in the top view of the layout.

23. The method of claim 16, wherein the depth of the concave surface is about 200 Å to 500 Å.

24. The method of claim 16, wherein the thickness of the isolation layer is about 300 Å to 800 Å.

25. The method of claim 16, wherein the material of the isolation layer includes silicon nitride.

26. The method of claim 16, wherein the material of the isolation layer includes silicon oxide.

27. The method of claim 16, wherein the first etching step includes anisotropic dry etching.

28. The method of claim 16, wherein the second etching step includes anisotropic dry etching.

29. The method of claim 16, wherein the third etching step includes anisotropic dry etching.

30. The method of claim 16, wherein the fourth etching step includes anisotropic dry etching.

31. The method of claim 16, wherein the step of forming the bit line includes using silane as a reactant gas and As and P ion are doped at the same time by using low pressure chemical vapor deposition at a temperature of about 550° C. to 650° C. to form a doped polysilicon layer and a polycide layer.

* * * * *